(12) United States Patent
Wilke et al.

(10) Patent No.: US 11,728,444 B2
(45) Date of Patent: Aug. 15, 2023

(54) ARRANGEMENT FOR AN OPTOELECTRONIC COMPONENT, MANUFACTURING PROCESS AND OPTOELECTRONIC COMPONENT

(71) Applicant: First Sensor AG, Berlin (DE)

(72) Inventors: Martin Wilke, Berlin (DE); Sabine Friedrich, Dresden (DE); Stephan Dobritz, Dresden (DE)

(73) Assignee: First Sensor AG, Berlin (DE)

( * ) Notice: Subject to any disclaimer, the term of this patent is extended or adjusted under 35 U.S.C. 154(b) by 240 days.

(21) Appl. No.: 17/336,597

(22) Filed: Jun. 2, 2021

(65) Prior Publication Data
US 2021/0408302 A1 Dec. 30, 2021

(30) Foreign Application Priority Data
Jun. 30, 2020 (DE) .......................... 102020117238.9

(51) Int. Cl.
*H01L 31/0216* (2014.01)
*H01L 31/18* (2006.01)

(52) U.S. Cl.
CPC ........ *H01L 31/02162* (2013.01); *H01L 31/18* (2013.01)

(58) Field of Classification Search
CPC ............... H01L 31/02162; H01L 31/18; H01L 31/02005; H01L 31/022408; H01L 31/0216; H01L 33/44; H01L 31/02002; H01L 31/02161
See application file for complete search history.

(56) References Cited

U.S. PATENT DOCUMENTS

| 7,342,259 | B2* | 3/2008 | Nagawa | H01L 24/18 |
| | | | | 257/98 |
| 7,939,932 | B2 | 5/2011 | Martin | |
| 9,508,903 | B2 | 11/2016 | Fehrer et al. | |
| 9,768,360 | B2* | 9/2017 | Fehrer | H01L 24/48 |
| 10,818,805 | B2* | 10/2020 | Kalz | H01L 31/0216 |
| 2021/0408302 | A1* | 12/2021 | Wilke | H01L 31/02162 |

FOREIGN PATENT DOCUMENTS

| DE | 102009058796 A1 | 6/2011 | |
| WO | 2015044529 A1 | 4/2015 | |
| WO | WO-2015044529 A1 * | 4/2015 | ......... H01L 31/0203 |
| WO | 2018019921 A1 | 2/2018 | |

* cited by examiner

*Primary Examiner* — Earl N Taylor
(74) *Attorney, Agent, or Firm* — Barley Snyder

(57) ABSTRACT

An arrangement for an optoelectronic component includes a substrate and an optical semiconductor chip arranged on the substrate. The optical semiconductor chip has an optically active region, a first optically non-active region, and a second optically non-active region. A connection structure connects a chip-side electrical connection to the optically active region. An electrical connection connects the chip-side electrical connection to a second substrate-side electrical connection. A coating is provided in a layer stack in the optically active region, in the first optically non-active region, and in the second optically non-active region. The layer stack includes a first layer and a second layer arranged above the first layer. The chip-side electrical connection and the connection structure in the first optically non-active region and the protective layer in the second optically non-active region are each arranged between the first layer and the second layer.

18 Claims, 4 Drawing Sheets

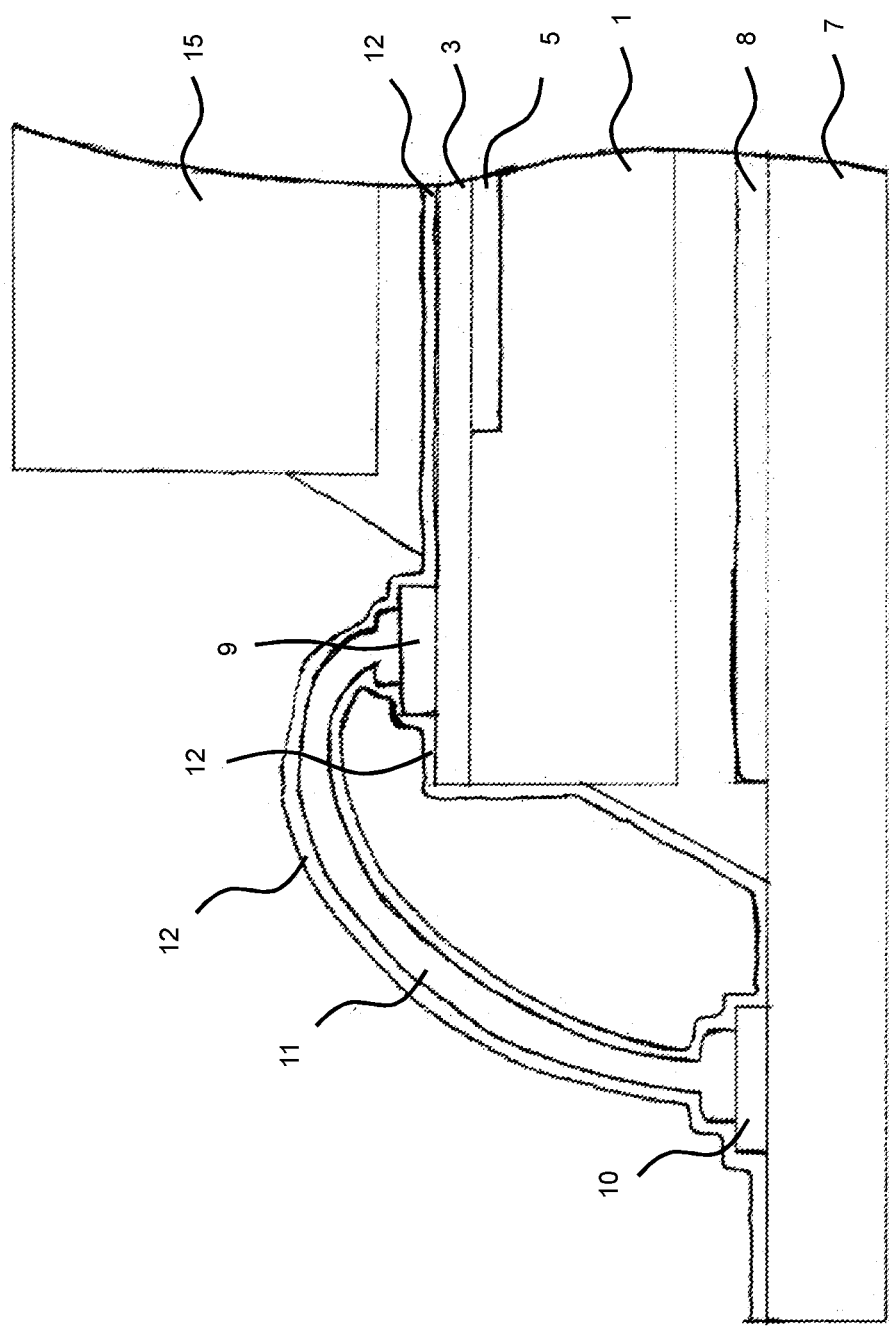

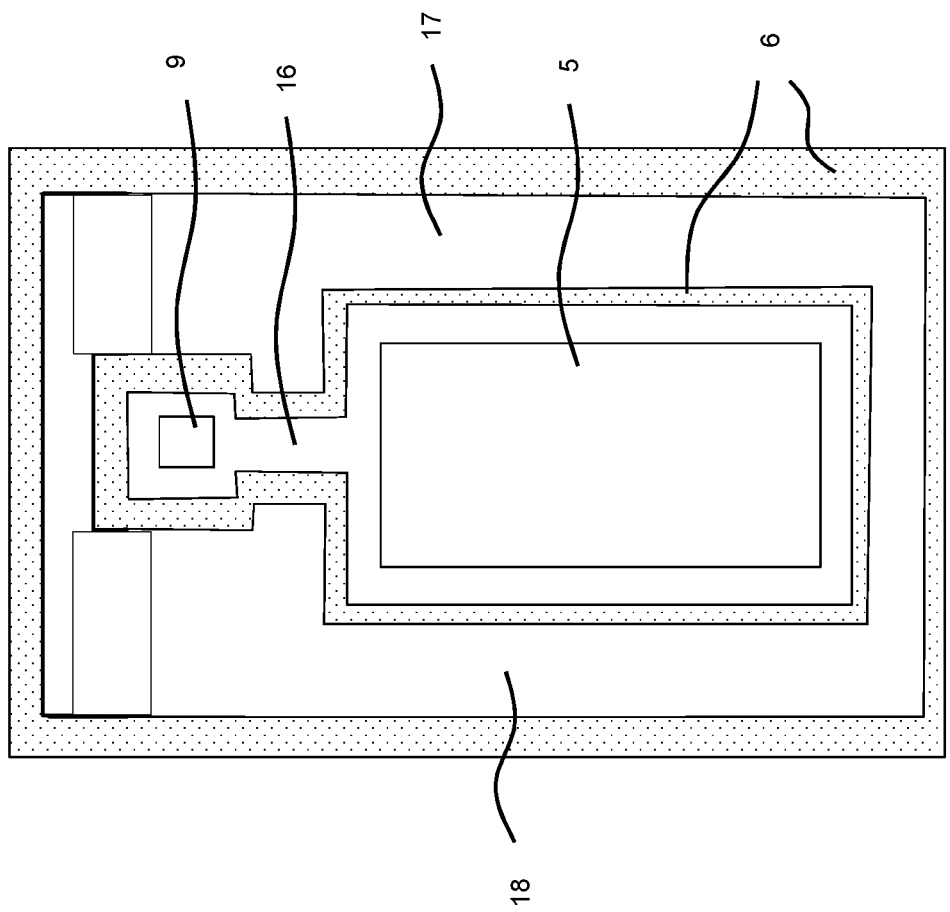

ARRANGEMENT FOR AN OPTOELECTRONIC COMPONENT, MANUFACTURING PROCESS AND OPTOELECTRONIC COMPONENT

CROSS-REFERENCE TO RELATED APPLICATION

This application claims the benefit of the filing date under 35 U.S.C. § 119(a)-(d) of German Patent Application No. 102020117238.9, filed on Jun. 30, 2020.

FIELD OF THE INVENTION

The present invention relates to an arrangement for an optoelectronic component and a method for producing the arrangement and the optoelectronic component.

BACKGROUND

Optoelectronic components usually have an optical semiconductor chip which is arranged on a substrate and connected to an electrical contact on the substrate side. The optoelectronic semiconductor chip has an optically active region which is set up to receive and/or emit light during operation. Connections of the optical semiconductor chip are connected to substrate-side connections, for example by wire bonding.

Such an optoelectronic component is known, for example, from the document WO 2015/044529 A1. A protective layer is provided on the substrate of the optoelectronic component and extends across the bonding of substrate and optical semiconductor chip in a covering manner. An electrical connection formed on the substrate is arranged below the protective layer.

Document DE 10 2009 058 796 A1 discloses an optoelectronic component and a method for production. The optoelectronic component has an inorganic optoelectronically active semiconductor component with an optically active region which is suitable for emitting or receiving light during operation. A sealing material applied by atomic layer deposition is arranged on at least one surface area and hermetically seals the surface area.

U.S. Pat. No. 7,939,932 B2 provides for coating the surface of a semiconductor chip with an inorganic dielectric film material, in particular $Al_2O_3$ or $TiO_2$, which also includes coating of the electrical connections.

The document WO 2018/019921 A1 discloses an optical sensor in which a layer made of a photoconductive material is provided with an outer cover layer.

SUMMARY

An arrangement for an optoelectronic component includes a substrate and an optical semiconductor chip arranged on the substrate. The optical semiconductor chip has an optically active region, a first optically non-active region, and a second optically non-active region. A connection structure connects a chip-side electrical connection to the optically active region. An electrical connection connects the chip-side electrical connection to a second substrate-side electrical connection. A coating is provided in a layer stack in the optically active region, in the first optically non-active region, and in the second optically non-active region. The layer stack includes a first layer and a second layer arranged above the first layer. The chip-side electrical connection and the connection structure in the first optically non-active region and the protective layer in the second optically non-active region are each arranged between the first layer and the second layer.

BRIEF DESCRIPTION OF THE DRAWINGS

The invention will now be described by way of example with reference to the accompanying Figures, of which:

FIG. 3 is a schematic side view of the arrangement of FIG. 2, in which an optical window component is arranged on the optical semiconductor chip in an optically active region of the optical semiconductor chip; and FIG. 4 is a schematic plan view of an arrangement according to another embodiment in which the optical semiconductor chip is arranged on a substrate.

DETAILED DESCRIPTION OF THE EMBODIMENT(S)

Figure 1:
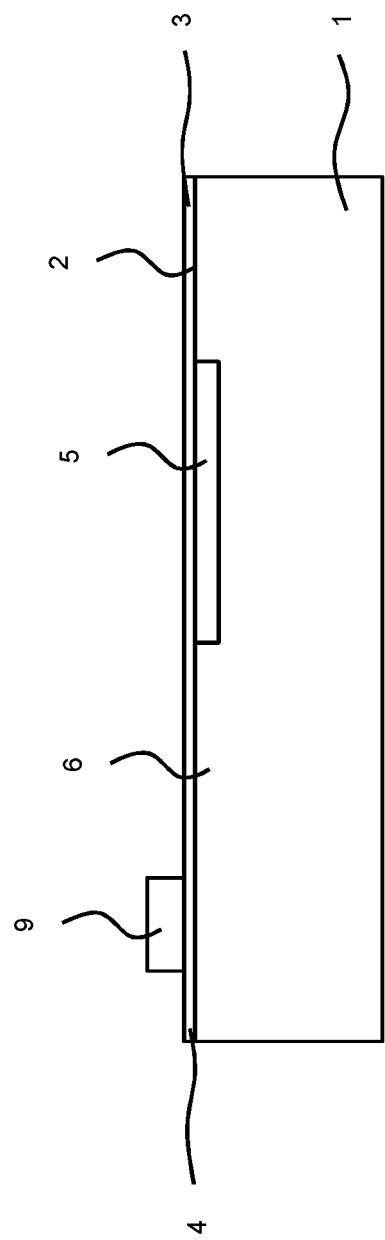
FIG. 1 is a schematic side view of an optical semiconductor chip according to an embodiment having a first layer of a functional coating on the top side.

FIG. 1 is a schematic depiction of an optical semiconductor chip 1 which has been separated from a wafer assembly and has a first layer 3 of a coating 4 on a top surface 2. The first layer 3 was deposited at the wafer level and is embodied continuously both in an optically active region 5 and in a first optically non-active region 6 of the optical semiconductor chip 1. The optically active region 5 receives light during operation and converts the light into electrical charges. The first layer 3 can comprise $SiO_2$, $Si_3N_4$, or a combination of these materials, for example. The first layer 3 of the coating 4 is made of at least one of the materials $SiO_2$ and $Si_3N_4$. $SiO_2$ and/or $Si_3N_4$ can each have a layer thickness of about 5 nm to about 250 nm and $Si_3N_4$ of about 5 nm to 250 nm.

Figure 2:
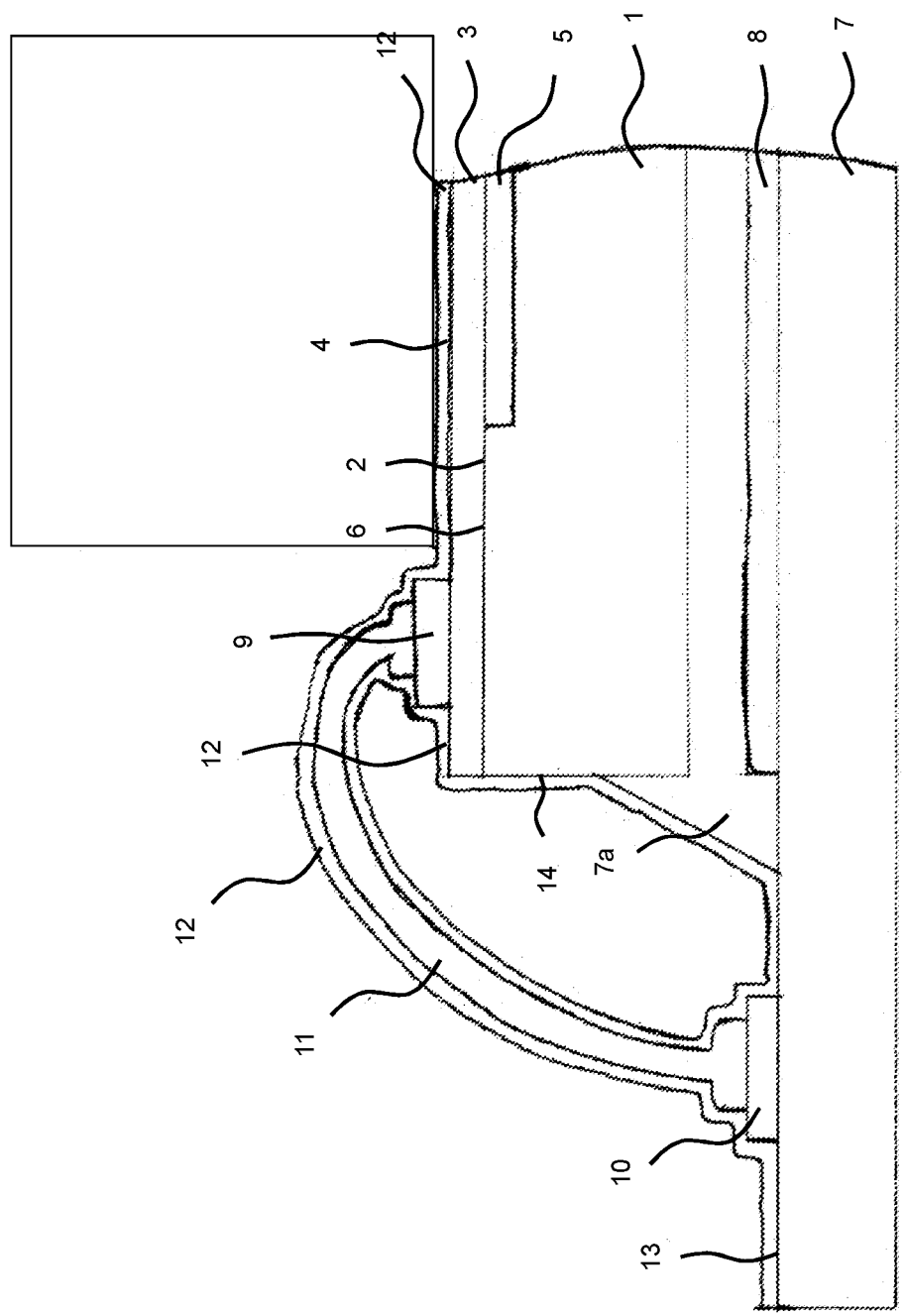
FIG. 2 is a schematic side view of an arrangement in which the optical semiconductor chip is arranged on a substrate.

FIG. 2 is a schematic depiction of an arrangement for an optoelectronic component in which the optical semiconductor chip 1 is arranged on a substrate 7, for example by an adhesive material 7a; the optical semiconductor chip 1 can be glued on the substrate 7 by the adhesive material 7a. The optical semiconductor chip 1 is electrically contacted via a first substrate-side electrical connection 8. The substrate 7 can be formed, for example, by a printed circuit board which has conductor tracks for the electrical connections.

As shown in FIG. 2, on the top surface 2 of the optical semiconductor chip 1, a chip-side electrical connection 9 with a multilayer structure is produced on the first layer 3. An electrical connection 11 is formed between the chip-side electrical connection 9 and a second substrate-side electrical connection 10, for example by wire bonding. The chip-side electrical connection 9 and/or the substrate-side electrical connections 8, 10 can be contact pads or conductor tracks.

The multilayer structure of the chip-side electrical connection 9 can have a first layer made of an aluminum material. The first layer made of the aluminum material can form a lowermost layer in the multilayer structure of the chip-side electrical connection 9. One layer or several further layers in a multi-layer structure are arranged on the bottom layer. The first layer of the multilayer structure of the chip-side electrical connection 9 made of aluminum material can be arranged in direct contact with the first layer 3 of the coating 4, that is, may be deposited thereon. The aluminum material can comprise aluminum or an aluminum alloy, for example AlSi, AlSiCu, or AlCu. For the first layer, for example when it is embodied from the aluminum material, a layer thickness of approximately 300 nm to approximately 1400 nm can generally be provided.

A second layer 12 of the coating 4 is applied covering the entire surface of the assembly shown in FIG. 2, both in the optically active region 5 and in the first optically non-active region 6, but also on substrate-side segments 13 and lateral surfaces 14 of the optical semiconductor chip 1. A rear side of the substrate 7 can remain uncoated. The electrical connection 11 can have an electrical line or an electrical line section which is covered on the surface side, at least in sections, by the second layer 12 of the coating 4. The electrical connection 11 can be formed by a wire, the surface of which is covered with the second layer 12 of the coating 4. The second layer 12 is arranged above the first layer 3 in a layer stack of the coating 4.

The second layer 12 is made of an inorganic material. It can be a multilayer structure with two or more materials which have a different refractive index and can be deposited alternately. In the simplest case it is a two-layer system. In one embodiment, the following can be provided: $Al_2O_3$ (20 nm) and then $Ta_2O_5$ (65 nm). However, these two layers can also be deposited alternately one after the other in thinner layers, even with different thicknesses (for example 20 layer sequences of $Al_2O_3$ and $Ta_2O_5$, each with different layer thicknesses). The total thickness of the multilayer structure of the second layer 12 can be less than about 250 nm, for example. The individual layers have at least a layer thickness of approximately 1 nm.

Using the coating 4, the reflectivity in the arrangement with the optical semiconductor chip 1 and the substrate 7 is reduced on the surface side (wavelength-selective), wherein a different reflective capacity (reflectivity) is embodied in the optically active region 5 and in the first optically non-active region 6 with the chip-side electrical connection 9.

The reflectivity in the optically active region 5 is significantly lower for a selected wavelength range than in the first optically non-active region 6. For example, the first optical reflectivity for a target wavelength or a target wavelength range in the optically active region 5 is not greater or less than approximately 10%, less than approximately 6%, less than approximately 3%, or approximately 1%. Residual reflection in the optically active region 5 is greater than 0 percent.

In the first optically non-active region 6 with the chip-side electrical connection 9, however, the second optical reflectivity for the target wavelength or the target wavelength range can be not greater or less than approximately 50%, less than approximately 40%, less than approximately 30%, or less than approximately 10%. The antireflection effect in the region of the chip-side electrical connection 9 is based on the interaction of the first and the second layers of the coating 4 and the multilayer arrangement of the chip-side electrical connection 9, which is arranged therebetween.

In the production process, according to FIG. 3 an optical window component 15 is then applied in the optically active region 5 of the optical semiconductor chip 1, for example by gluing. The optical window component 15 can comprise, for example, a glass material and can optionally provide optical filter properties. The optical window component 15 can be arranged on the coating 4 above the optically active region 5. The optical window component 15 can, for example, be set up to allow light only in a target wavelength range to pass through, for example in the range from approximately 840 nm to approximately 980 nm. For arranging in the optically active region 5, the window component 15 can be glued, in particular directly onto the coating 4.

In one configuration, it can be provided that the second layer 12 of the coating 4 is applied or deposited before the electrical connection 11 is formed. In this case, the electrical connection 11 is established using the second layer 12, for example by wire bonding. The second layer 12 forms protection against contamination that can occur during wire bonding. The chip-side electrical connection 9 is also protected from contamination by the second layer 12 of the coating 4, for example during gluing or other packaging processes after the electrical connection 11 has been formed, which is done for example by wire bonding.

FIG. 4 is a schematic plan view of a further arrangement for an optoelectronic component in which the optical semiconductor chip 1 is arranged on a substrate 7. The same reference symbols are used for the same features. The chip-side electrical connection 9, which is connected to the optical semiconductor chip 1 via an electrically conductive connection structure 16, is arranged in the first optically non-active region 6. The electrically conductive connection structure 16 can have a metal layer made of at least one metal from the following group: Al, Cr, Ti, W, Ni, V, an oxide of Al, Cr, Ti, W, Ni, or V, and an alloy whose main component is Al, Cr, Ti, W, Ni, or V. The electrically conductive connection structure 16 can be formed in a single layer or with a multi-layer structure. In the case of the multilayer structure, the configuration options mentioned above apply accordingly for each of the layers in the stack. In the case of a multi-layer structure, a metal layer can form the topmost layer. In one possible embodiment, the layer stack can comprise two layers, for example an aluminum layer and a chromium layer arranged thereon. Examples of possible layers include at least one arrangement from the following group: Al; AlSi (an Al layer alloyed with Si); Al+Cr (aluminum with a chrome layer thereon); $Al+Cr_2O_3$ (aluminum with a chromium oxide layer thereon) and $AlSi+Cr+Cr_2O_3$ (aluminum with a chromium oxide layer and titanium thereon).

The preceding explanations about the layer structure and materials apply accordingly to the electrical connection on the chip side. In one embodiment, this is formed in one layer, for example as an aluminum layer. Such an embodiment can be produced, for example, in that the regions of the chip-side electrical connection 9 and the electrically conductive connection structure 16 are initially each produced as a two-layer structure and then the upper layer, for example the chromium layer in the region of the chip-side electrical connection 9, is removed again.

The first optically non-active region 6 can have regions that are not included in the connection structure 16 and the chip-side electrical connection 9. In these regions, the first layer 3 can consist of at least one of the materials $SiO_2$ and $Si_3N_4$. An embodied layer thickness can be different from that in the optically active region 5.

Outside the optically active region 5, in addition to the first optically non-active region 6, a second optically non-active region 17 has a protective layer 18 deposited and covering the second optically non-active region 17 as shown in FIG. 4, which optically prevents the penetration of light into the optical semiconductor chip 1 in the second optically non-active region 17; reducing or essentially completely preventing the penetration of light. The protective layer 18 is designed to reduce the incidence of light in the semiconductor chip in the region outside the optically active region 5. The layer structure can be the same as the layer structure of the electrically conductive connection structure 16; in one embodiment, the protective layer 18 can be made of the same material as the connection structure 16. The first optically non-active region 6 can partially or completely enclose the second optically non-active region 17. The second optically non-active region 17 is formed separately from the first optically non-active region 6.

In the arrangement for the optoelectronic component, the coating 4 in the optically active region 5 and in the first and second optically non-active regions 6, 17 of the optical semiconductor chip 1 has a different layer structure, which is in particular a consequence of including the chip-side electrical connection 9, the connection structure 16, and the protective layer 18 between the first and second layers 3, 12 of the coating 4. In this way, specifically desired (different) properties, in particular reflection properties, for light incident on the surface of the arrangement or the surface of the optoelectronic component can be embodied in the optically active region 5 and the optically non-active regions 6, 17.

The proposed technology enables high sensitivity and high reliability for optical sensor systems. In order to achieve high sensitivity, the entire chip surface, which is formed with a sensitive (optically active 5) and non-sensitive (optically inactive 6) region, can be anti-reflective for a target wavelength or a target wavelength range. The anti-reflective coating in the optically active region 5 is used to achieve high light output in the sensor, which light output can be converted into an electrical signal. This is important for high sensitivity. The anti-reflective coating in the optically non-active region(s) 6, 17 in particular minimizes back reflections on the optically active region 5 and avoids false signals caused thereby. The second optical reflectivity in the second optically non-active region 17 is the same as for the first optically non-active region 6.

For high reliability of the systems in which the sensor chip is installed, the active chip surface can be provided with protection that prevents halides or other contaminants from coming into contact with the contact pads, conductor tracks, and metal structures. These impurities are applied, for example, when potting bonding wires (glob top), gluing the chip surface with optical system components, or potting the system ("dam and fill" or "molding"). The filled or unfilled polymers used for this or other methods often contain components that promote or trigger corrosion of the chip.

By the coating 4, a first reflectivity can be embodied for an optical (target) wavelength range between a first and a second wavelength in the optically active region 5 and a second reflectivity can be embodied in each of the first and second optically non-active regions 6, 17, each of which, for the wavelength range, is greater than the first reflectivity. The second reflectivity in the first and the second optically non-active region 6, 17 can be the same or different, wherein it is always greater than the first reflectivity for the wavelength range. The coating 4 can therefore also be referred to as an anti-reflective coating.

In one embodiment, it is provided that the optical wavelength range comprises wavelengths from approximately 840 nm to approximately 980 nm, alternatively a wavelength range from approximately 880 nm to approximately 915 nm. Embodiment of the reflectivity behavior in other wavelength ranges can also be provided. The multi-layer design of the coating 4 makes it possible to select different materials for the layers.

The first layer 3 of the coating 4 can be formed with different layer thicknesses in the different areas covered, that is, the optically active region 5 and the first and second optically inactive regions 6, 17. In addition to the first and second layers, the coating 4 can have at least one further layer.

The coating 4 can be implemented as a continuous coating in the optically active region 5 and in the first and the second optically non-active regions 6, 17. In addition, it can be provided that the coating 4 is also embodied continuously in a region between the optically active region 5 and the optically non-active regions 6, 17. In the case of the bonding with the substrate 7 and optical semiconductor chip 1, the coating 4 can be embodied to cover an entire surface on the cover side. If the arrangement is provided in an optoelectronic component, a surface region on which light can fall during operation can essentially be completely covered with the coating 4. It is also possible for surface regions of the optical semiconductor chip 1, which regions do not run transverse to the direction of incidence of light and which are more oriented in the direction of incidence of light, to be covered with the coating 4 up to the region of the substrate 7.

Further configuration options are explained below.

In one configuration, the first layer 3 can be produced from $SiO_2$ as a layer with a thickness of approximately 20 nm.

In this or other configurations, the chip-side electrical connection 9 in a multilayer structure can have metallization with the following layers: 1.1 μm Al and 60 nm Cr.

In the various configurations, the second layer 12 of the coating 4 can be formed from AlN with a layer thickness of approximately 80 μm. However, other electrically insulating materials (insulator materials) can also be used, wherein a layer thickness of approximately 10 nm to approximately 250 nm can be provided.

Further embodiments can provide one or more of the following configurations:

$HfO_2$ (95 nm) on a layer stack on the optical semiconductor chip: pixel ($SiO_2$ 20 nm)/metal (approx. 1 μm Al+60 nm Cr)

$Al_2O_3$ (105 nm) on a layer stack on the optical semiconductor chip: pixel ($SiO_2$ 20 nm)/metal (approx. 1 μm+60 nm Cr)

$Al_2O_3$ 30 nm+AlN 50 nm on a layer stack on the optical semiconductor chip: pixel ($SiO_2$ 20 nm)/metal (approx. 1 μm+60 nm Cr)

$Al_2O_3$ 30 nm+AlN 50 nm on a layer stack on the optical semiconductor chip: pixel ($SiO_2$ 20 nm)/metal (approx. 1 μm+100 nm Ti)

$Al_2O_3$ 20 nm+$Ta_2O_5$ 65 nm on a layer stack on the optical semiconductor chip: pixel ($SiO_2$ 20 nm)/metal (approx. 1 μm+60 nm Cr)

In a manufacturing method, it can be provided that the first layer 3 of the coating 4 is applied, while the optical semiconductor chip 1 is still arranged in the wafer assembly, before the step of separating the chips 1 is then carried out. The first layer 3 of the coating 4 is thus embodied both in the optically active region 5 and in the optically non-active region 6. After the wafer has been separated to embody the optical semiconductor chips 1, the semiconductor chip 1 is applied to the substrate 7, for example by gluing. After the electrical connections have been established, the second layer 12 of the coating 4 can be deposited, to which end the "atomic layer deposition" technology can be used, for example. The second layer 12 is also applied both in the optically active region 5 and in the optically non-active region 6 in which the chip-side electrical connection 9 with its multilayer structure is arranged. The second layer 12 of the coating 4 can be deposited at low temperatures, for example at temperatures of about 150° to about 300° C. This permits the second layer 12 of the coating 4 to be deposited during a packaging process.

Further steps can then follow in the production or manufacturing process, for example the application of an optical window component 15 in the optically active region 5 on the front side of the optical semiconductor chip 1, for example by gluing.

The coating 4 can form a moisture barrier to keep moisture away from the chip surface and the electrical connections. The coating 4 can therefore also be referred to as an anti-reflective and protective coating (multifunctional coating).

The configurations described above in connection with the arrangement for the optoelectronic component can be provided accordingly in connection with the optoelectronic component and the method for producing the arrangement.

The features disclosed in the above description, claims, and drawings implement the various configurations, both individually and in any combination.

What is claimed is:

1. An arrangement for an optoelectronic component, comprising:
   a substrate;
   an optical semiconductor chip arranged on the substrate and connected to a first substrate-side electrical connection, the optical semiconductor chip has an optically active region, a first optically non-active region, and a second optically non-active region, the optically active region receives light during operation and converts it into electrical charges, the second optically non-active region is formed separately from the first optically non-active region and is covered with a protective layer;
   a chip-side electrical connection formed in the first optically non-active region;
   a connection structure formed in the first optically non-active region, the connection structure connecting the chip-side electrical connection to the optically active region in an electrically conductive manner;
   an electrical connection connecting the chip-side electrical connection to a second substrate-side electrical connection; and
   a coating provided in a layer stack in the optically active region, in the first optically non-active region, and in the second optically non-active region, the layer stack including a first layer made of at least one of the materials $SiO_2$ and $Si_3N_4$, and a second layer made of an inorganic material and arranged above the first layer in the layer stack, the chip-side electrical connection and the connection structure in the first optically non-active region and the protective layer in the second optically non-active region are each arranged between the first layer and the second layer of the coating.

2. The arrangement of claim 1, wherein a first reflectivity for an optical wavelength between a first wavelength and a second wavelength is embodied in the optically active region by the coating.

3. The arrangement of claim 2, wherein a second reflectivity for an optical wavelength greater than the first reflectivity is embodied in each of the first optically non-active region and the second optically non-active region by the coating.

4. The arrangement of claim 2, wherein the first reflectivity in the optically active region is not greater than 10 percent.

5. The arrangement of claim 3, wherein the second reflectivity in the first optically non-active region and the second optically non-active region is not greater than 50 percent.

6. The arrangement of claim 1, wherein the coating in the optically active region, in the first optically non-active region, and in the second optically non-active region is a continuous coating.

7. The arrangement of claim 1, further comprising an optical window component arranged above the optically active region on the coating.

8. The arrangement of claim 7, wherein the optical window component allows light only in a target wavelength range to pass through.

9. The arrangement of claim 1, wherein the electrical connection has an electrical line that is covered, at least in sections, on a surface by the second layer of the coating.

10. The arrangement of claim 1, wherein the chip-side electrical connection has a multilayer structure with a layer made of an aluminum material.

11. The arrangement of claim 10, wherein the layer made of the aluminum material is a lowermost layer of the multilayer structure and is in direct contact with the first layer of the coating.

12. The arrangement of claim 1, wherein the connection structure has a metal layer made of a metal material.

13. The arrangement of claim 12, wherein the metal material is selected from Al, Cr, Ti, W, Ni, V, an oxide of Al, Cr, Ti, W, Ni, or V, and an alloy whose main component is Al, Cr, Ti, W, Ni, or V.

14. The arrangement of claim 1, wherein the optical semiconductor chip is attached to the substrate by an adhesive material.

15. The arrangement of claim 1, wherein the chip-side electrical connection, the first substrate-side electrical connection, and/or the second substrate-side electrical connection are contacts pads or conductor tracks.

16. An optoelectronic component, comprising:
    an arrangement including:
    a substrate;
    an optical semiconductor chip arranged on the substrate and connected to a first substrate-side electrical connection, the optical semiconductor chip has an optically active region, a first optically non-active region, and a second optically non-active region, the optically active region receives light during operation and converts it into electrical charges, the second optically non-active region is formed separately from the first optically non-active region and is covered with a protective layer;
    a chip-side electrical connection formed in the first optically non-active region;
    a connection structure formed in the first optically non-active region, the connection structure connecting the chip-side electrical connection to the optically active region in an electrically conductive manner;
    an electrical connection connecting the chip-side electrical connection to a second substrate-side electrical connection; and
    a coating provided in a layer stack in the optically active region, in the first optically non-active region, and in the second optically non-active region, the layer stack including a first layer made of at least one of the materials $SiO_2$ and $Si_3N_4$, and a second layer made of an inorganic material and arranged above the first layer in the layer stack, the chip-side electrical connection and the connection structure in the first optically non-active region and the protective layer in the second optically non-active region are each arranged between the first layer and the second layer of the coating.

17. A method for producing an arrangement for an optoelectronic component, comprising:
  providing a substrate;
  arranging an optical semiconductor chip on the substrate, the optical semiconductor chip is electrically connected to a first substrate-side connection, the optical semiconductor chip has an optically active region, a first optically non-active region, and a second optically non-active region, the optically active region receives light during operation and converts it into electrical charges, the second optically non-active region is formed separately from the first optically non-active region;
  producing a chip-side electrical connection and a connection structure in the first optically non-active region, the connection structure connecting the chip-side electrical connection to the optically active region in an electrically conductive manner;
  producing a protective layer in the second optically non-active region;
  establishing an electrical connection between the chip-side electrical connection and a second substrate-side electrical connection; and
  producing a coating provided in a layer stack in the optically active region, in the first optically non-active region, and in the second optically non-active region, the layer stack including a first layer made of at least one of the materials $SiO_2$ and $Si_3N_4$, and a second layer made of an inorganic material and arranged above the first layer in the layer stack, the chip-side electrical connection and the connection structure in the first optically non-active region and the protective layer in the second optically non-active region are each arranged between the first layer and the second layer of the coating.

18. The method of claim 17, wherein the second layer of the coating is deposited before the electrical connection between the chip-side electrical connection and the second substrate-side electrical connection is formed.

* * * * *